United States Patent
Nguyen Van Dau et al.

(10) Patent No.: US 7,094,480 B2
(45) Date of Patent: Aug. 22, 2006

(54) MAGNETIC FIELD SENSOR USING MAGNETORESISTANCE AND METHOD FOR MAKING SAME

(75) Inventors: Frederic Nguyen Van Dau, Palaiseau (FR); Henri Jaffres, Orsay (FR); Daniel Lacour, Paris (FR)

(73) Assignee: Thales, Paris (FR)

( * ) Notice: Subject to any disclaimer, the term of this patent is extended or adjusted under 35 U.S.C. 154(b) by 228 days.

(21) Appl. No.: 10/276,693

(22) PCT Filed: Apr. 27, 2001

(86) PCT No.: PCT/FR01/01321

§ 371 (c)(1),
(2), (4) Date: Nov. 18, 2002

(87) PCT Pub. No.: WO01/88562

PCT Pub. Date: Nov. 22, 2001

(65) Prior Publication Data

US 2003/0157368 A1    Aug. 21, 2003

(51) Int. Cl.
*G11B 5/127*    (2006.01)
(52) U.S. Cl. .............. 428/811.5; 428/813; 428/811.2; 360/324.12
(58) Field of Classification Search ............ 360/324.2; 428/611, 692
See application file for complete search history.

(56) References Cited

U.S. PATENT DOCUMENTS

| | | | |
|---|---|---|---|
| 5,650,958 A * | 7/1997 | Gallagher et al. .......... 365/173 |
| 5,686,879 A | 11/1997 | Schuhl et al. | |
| 6,104,632 A * | 8/2000 | Nishimura .................. 365/158 |
| 6,185,079 B1 * | 2/2001 | Gill .......................... 360/324.2 |
| 6,191,581 B1 | 2/2001 | Van Dau et al. | |
| 6,259,586 B1 * | 7/2001 | Gill .......................... 360/324.2 |
| 6,574,079 B1 * | 6/2003 | Sun et al. ................. 360/324.2 |
| 6,710,987 B1 * | 3/2004 | Sun et al. ................. 360/324.2 |

FOREIGN PATENT DOCUMENTS

| | | |
|---|---|---|
| EP | 0 710 850 | 5/1996 |
| WO | 00 79297 | 12/2000 |

\* cited by examiner

*Primary Examiner*—Kevin M. Bernatz
(74) *Attorney, Agent, or Firm*—Oblon, Spivak, McClelland, Maier & Neustadt P.C.

(57) ABSTRACT

The invention relates to magnetic field sensors in which magnetoresistance is used as the physical phenomenon for detecting and measuring the magnetic field. It consists in producing a stack comprising a first ferromagnetic layer (101), an insulating layer (103), a second ferromagnetic layer (102) and an antiferromagnetic layer (104). The two ferromagnetic layers exhibit crossed magnetic anisotropies and form with the insulating layer a tunnel junction. The anisotropy of the first layer is obtained from the shape energy of the substrate on which this first layer rests and which is slightly misoriented with respect thereto. The anisotropy of the second layer is obtained by the action of the antiferromagnetic layer.

12 Claims, 8 Drawing Sheets

MAGNETIC FIELD SENSOR USING MAGNETORESISTANCE AND METHOD FOR MAKING SAME

BACKGROUND OF THE INVENTION

1. Field of the Invention

The present invention relates to magnetic field sensors which utilize the phenomenon of magnetoresistance, that is to say the variation in the electrical resistance of a conductor owing to the effect of the magnetic field that is applied to it. The invention allows sensors such as magnotometers, compasses or current sensors to be produced. It also relates to the processes for manufacturing such sensors.

2. Discussion of the Background

The entirely metallic magnetic sensors known at the present time are essentially those that utilize either anisotropic magnetoresistance (AMR) or giant magnetoresistance (GMR). In both cases, the resolution of the sensors of this type is limited by two sources of noise, one being associated with resistance fluctuations, also known as Johnson noise, and the other being associated with thermal drift.

Anisotropic magnetoresistance results from the anisotropic nature of the resistivity of a ferromagnetic metallic material as a function of the angle defined by its magnetization and the direction of the current. To best utilize this effect, the inventors have developed a system making use of the planar Hall effect, which makes it possible in particular for the noise associated with thermal drift to be considerably reduced. The maximum variation in the resistance due to this effect is around 1% of the resistance of the active region.

Giant magnetoresistance was discovered in 1998 and stems from the spin dependence of the resistance of an artificial magnetic structure having a magnetic configuration differing according to the magnetic field applied. A total resistance variation of the active region of the order of 10% or so can then be achieved.

The inventors have previously developed a patented device utilizing this giant magnetoresistance effect, which makes it possible to achieve various advantages over old-generation magnetic sensors. In particular, it is thus possible to increase the amplitude of the signal and to increase the signal-to-noise ratio possibly by up to an order of magnitude.

Finally, the phenomenon of tunnel magnetoresistance is known, this being a manifestation of the dependence of the current in a tunnel junction on the relative orientation of the magnetizations on each side of the insulating barrier forming this junction. This phenomenon corresponds to the conservation of spin of the electrons when they pass through this barrier by the tunnel effect. On this subject, mention may be made of the measurements taken by J. S. Moodera et al., Phys. Rev. Lett. 74 (16), 3273 (1995) on these ferromagnetic tunnel junctions at room temperature.

BRIEF SUMMARY OF THE INVENTION

Accordingly, it is an object of the present invention to obtain a total resistance variation of the order of a few tens of percent of the resistance of the active region. This resistance of the active region is itself more than several decades greater than the resistance of the known entirely metallic magnetic sensors. Overall, the magnetic sensitivity of such a sensor may therefore be greater of several orders of magnitude than the sensitivity of the conventional sensors.

In order to be able actually to obtain these results, the invention provides a magnetic field sensor utilizing magnetoresistance, mainly characterized in that it comprises a first ferromagnetic layer having a first magnetic anisotropy along a first direction, a second ferromagnetic layer having a second magnetic anisotropy along a second direction and an insulating layer which separates the two ferromagnetic layers and the thickness of which allows a tunnel junction to be formed between these two ferromagnetic layers.

According to another feature, the two anisotropy directions are perpendicular.

According to another feature, the first anisotropy is induced by a substrate that supports the first ferromagnetic layer.

According to another feature, the second anisotropy is induced by an antiferromagnetic AF layer superposed on the second ferromagnetic layer.

According to another feature, the two anisotropies have substantially different values so that one is "weak" and the other is "strong".

According to another feature, the "weak" ferromagnetic layer is the first layer.

According to another feature, the sensor comprises two sensors of the CAP+ type and two sensors of the CAP− type joined together to form a Wheatstone bridge in which each sensor of one type is adjacent to a sensor of the other type.

According to another feature, the first ferromagnetic layer is deposited on a misoriented substrate in order to induce the first magnetic anisotropy via the shape energy.

According to another feature, in order to obtain the second magnetic anisotropy, the second ferromagnetic layer is heated above the Néel temperature of the AF layer in contact with it and it is left to cool down below this temperature while applying a saturation magnetic field directed along the second direction to it.

According to another feature, in order to obtain the second magnetic anisotropy of the four sensors forming the Wheatstone bridge, all of these sensors are heated above the Néel temperature of the second ferromagnetic layer and a saturation magnetic field directed along the second anisotropy directions is applied to each sensor, placing on top of these four sensors an electrical circuit whose configuration allows the desired directions to be obtained locally.

BRIEF DESCRIPTION OF THE DRAWINGS

Further features and advantages of the invention will become clearly apparent from the following description, given as a non-limiting example with regard to the appended figures which show.

DETAILED DESCRIPTION OF THE INVENTION

Figure 1:
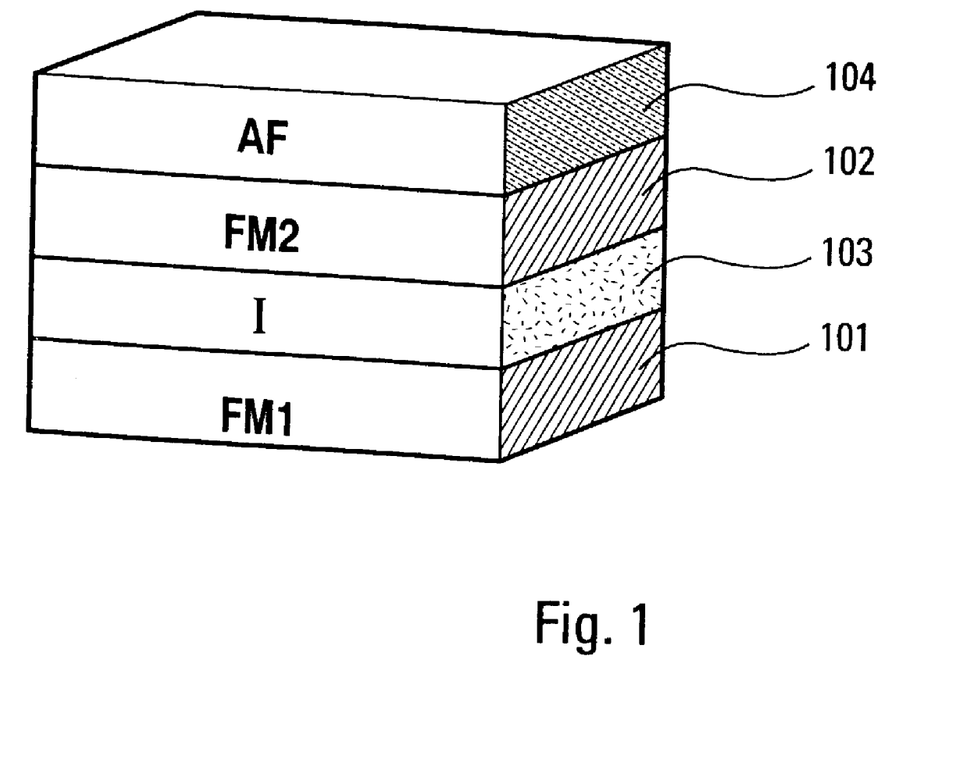
FIG. 1 is a perspective view of a multilayer stack for obtaining a sensor according to the invention.

FIG. 1 shows the thickness structure of a magnetic field sensor according to the invention. This structure comprises a stack of four layers supported by a substrate (not shown). A first layer FM1 101 is formed from a film of ferromagnetic material such as, for example, cobalt or iron, or a nickel/iron or cobalt/iron alloy.

A second layer FM2 102 is formed from a ferromagnetic material that may be of different composition or of different nature from that of the layer FM1.

A third layer I 103 is formed from an insulating material that can be deposited with an extremely small thickness in order to produce the tunnel junction. This material will be, for example aluminum oxide.

Finally, a fourth layer AF 104 is formed from a material such as a magnetic oxide or from a metallic antiferromagnetic material, such as an iron/manganese or iridium/manganese alloy. It may be relatively thick compared with the three previous layers, which are themselves relatively thin, or indeed very thin in the case of the layer I.

If it is desired to obtain a reversible and linear response of the signal in a weak field, it is necessary to use a particular magnetic configuration, called perpendicular geometry, in which the two magnetizations are oriented perpendicularly one with respect to the other in a zero field. This is because, as may be seen at the top of FIG. 2, when these two orientations are parallel to each other in a zero field, the change in direction of the orientation of these two layers 101 and 102 between a positive field and a negative field takes place for a particular value of the field, in this case in the negative region of the latter, by the reorientation of one and then of the other of the layers within a given range of this field. This bistable operation introduces a sudden and large change in the value of the resistance MR within the interval of the range. This nonlinear effect could possibly be used for other applications, but it does not make it possible to measure the field, as desired in the invention.

Figure 2:
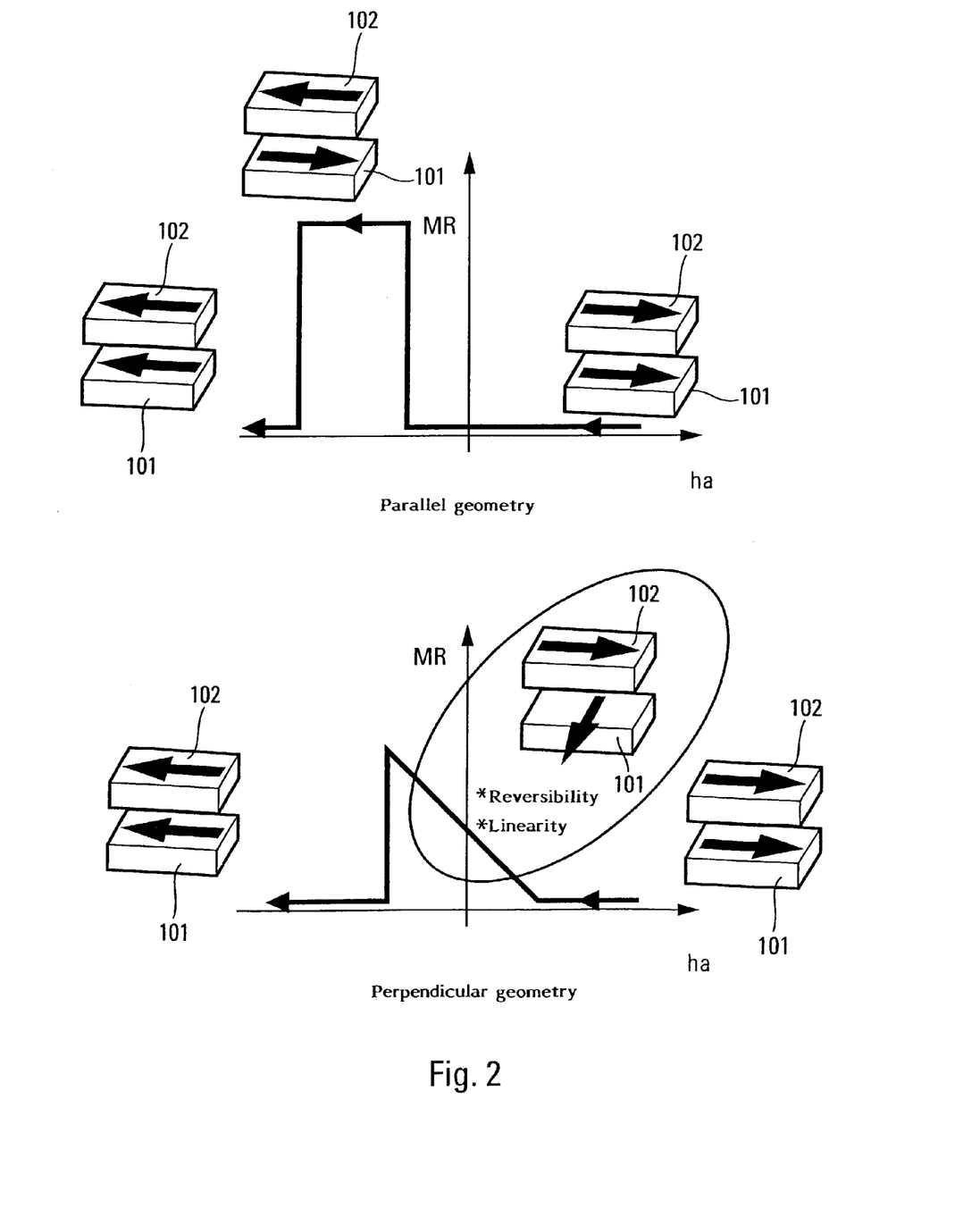
FIG. 2 is two graphs showing the variations in the mangnetoresistance as a function of the applied field, one in a parallel geometry and the other in a perpendicular geometry.

To obtain the structure in perpendicular geometry, it is therefore necessary for the anisotropies to be well controlled so as to create in each of the layers FM1 and FM2 a direction of easy magnetization which is perpendicular to that of the other layer and which allows a linear and reversible variation in the value of MR, as may be seen at the bottom of FIG. 2.

To do this, the invention proposes to use, in a manner similar to that used in giant magnetoresistance sensors, the properties of the misoriented vicinal Si(111) silicon surfaces to induce a preferential magnetization direction in the electrode FM1 in contact with the substrate on which the sensor is manufactured. The misorientation of the growth direction, of the order of a few degrees, is manifested by the appearance of terraces which induce a uniaxial magnetic anisotropy, coming from the shape energy. This particular direction is fixed by the geometry of the substrate, as explained more particularly in the article by Sussiau, F. Nguyen Van Dau, P. Galtier and A. Schuhl, published in Applied Physics Letters, Volume 69, 857 (1996).

To fix the direction of easy magnetization of the upper layer or electrode FM2, the invention proposes to use the exchange anisotropy created when this layer FM2 is covered with the antiferromagnetic layer AF. This phenomenon is described, for example, in the article by J. Noguès and Ivan K. Schuller, J. Magn. published in Magn. Mater., Vol. 192, 203–232 (1999). The anisotropy axis corresponds to the direction of the exchange field which appears below the antiferromagnetic-paramagnetic transition temperature of the material constituting this AF layer. This transition temperature is also known as the Néel temperature, called $T_N$. The direction in question is determined by the direction of the magnetization of the FM2 layer in contact with the AF layer, near $T_N$.

Figure 3:
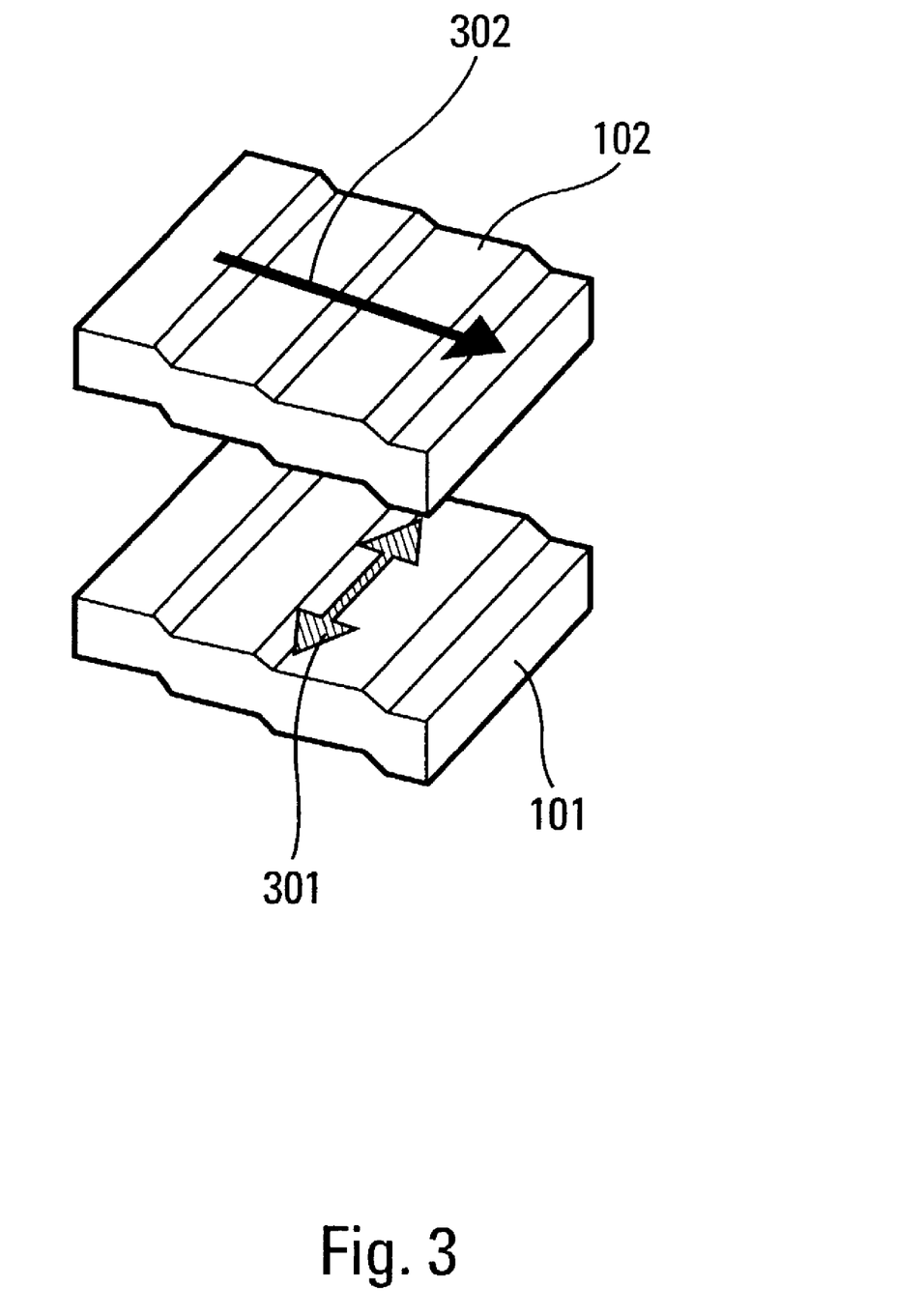
FIG. 3 is a perspective view explaining the way of obtaining a correct orientation of the magnetizations during manufacture of sensitive layers.

Therefore, to obtain the desired magnetic configuration, the invention proposes, as shown in FIG. 3, to heat the device above the temperature $T_N$ and then to let it cool while still applying a saturating magnetic field 302 to it, the direction of the field being orthogonal to the direction of the nominal easy axis 301 induced in the layer 101 by the substrate, as explained above.

Under these conditions, the anisotropy fields obtained for the two electrodes FM1 and FM2 have in general substantially different values. We will therefore define a layer called the "weak" layer, as being that in which the anisotropy field is the weaker, that is to say that which becomes magnetized more easily owing to the action of an external field. Hereafter in the description it will be assumed that the weak layer is that corresponding to the electrode FM1, but this implies no restriction as to the generality of the invention, the description and the operation being strictly identical, apart from the change in roles of the two layers in the contrary case.

The following parameters have therefore been defined:

$h_c$: the inversion field of FM1;

$h_k^1$: the anisotropy field acting on FM1;

$h_k^2$ and $h_{exc}$: the anisotropy field and exchange field acting on FM2;

the applied external field, that which must be detected or measured, will be called ha.

The operation of the sensor in its linear regime will now be described, that is to say the signal obtained in response to a magnetic field ha whose direction is fixed and whose amplitude varies will be explained.

Figure 4:
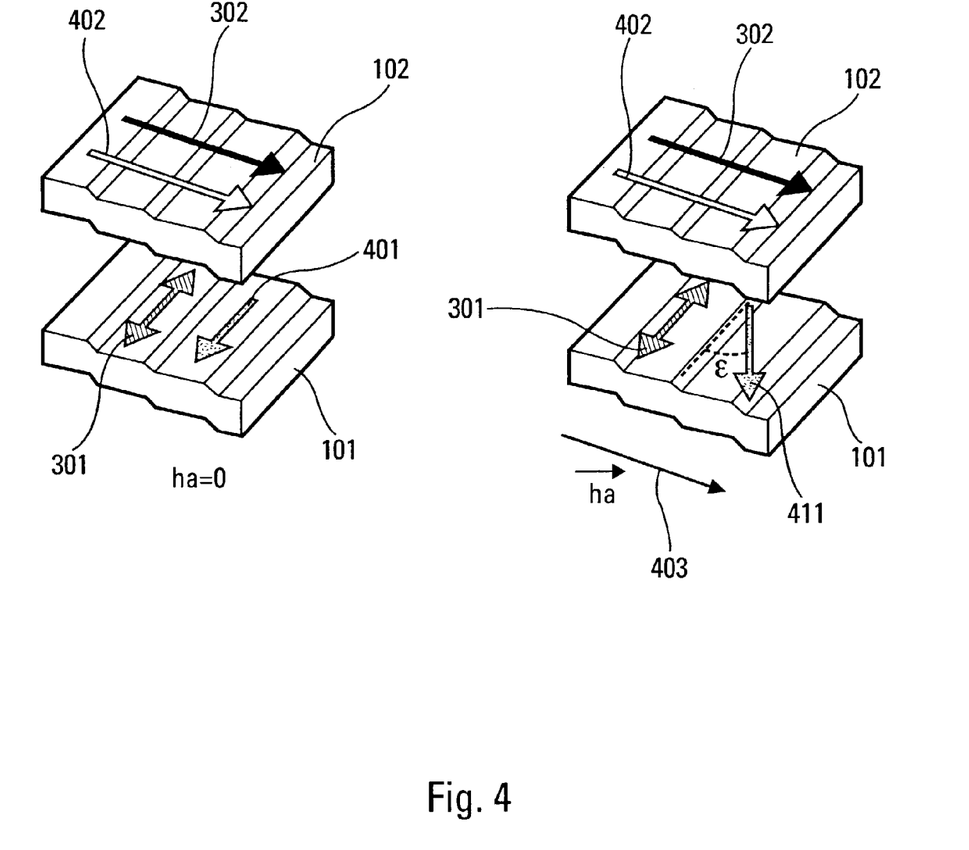
FIG. 4 is a perspective view showing the influence of magnetic field in the linear regime.

To obtain maximum sensitivity, this field ha is directed perpendicular to the axis 301 of easy magnetization of the FM1 weak layer 101. It is therefore parallel to the direction 302 of easy magnetization of the FM2 strong layer 102, as shown in FIG. 4.

Under these conditions, when the field ha is zero, the magnetization 401 of the weak layer 101 is parallel to the direction 301, and the magnetization 402 of the strong layer 102 is parallel to the direction 302.

When the field ha to be measured, 403, applied parallel to the direction 302, takes a value which is not zero, the magnetization 411 in the weak layer 101 deviates from the previous direction (when this field was zero) to be at an angle ε to the direction 301. This rotation of the magnetization in the plane of the FM1 layer 101 is more pronounced the higher the value of the field ha, as may be seen in FIG. 4.

The magnetization of the FM2 layer 102 itself remains locked along its easy axis 302, since, according to the definitions given above, the FM2 layer is "stronger" than the layer 101. This locking of the magnetization of FM2 persists until ha reaches the inversion field for the latter. By varying the composition of the materials of the two layers and the deviation in magnetization between the weak layer and the strong layer, it is possible for the latter condition to be easily satisfied.

The relative angle between the magnetizations of the two layers is therefore varied by the external magnetic field, which therefore causes a reversible variation in the magnetoresistance of the device and therefore in the signal obtained by measuring the resistance of the whole assembly.

For weak fields, that is to say when ha is very much less than $H_k^1$, the variation in magnetoresistance is substantially linear, that is to say $\epsilon \propto ha/H_k^1$.

The sensitivity of the device, which represents the variation in the measurement signal per unit field is itself inversely proportional to the anisotropy field $H_k^1$.

Such a sensor may also be used to determine the orientation of the magnetic field in which it is immersed, when this field remains constant while varying in orientation in the plane of the sensor, that is to say in the plane of the junction. This is called the angular response of this sensor.

The latter has in fact two separate operating regimes depending on whether the field in which it is immersed is "weak" or "strong".

In the case of a weak field, that is to say when ha <$h_c$, the application of this weak field has the effect, as already shown in FIG. 4, of varying the relative angle between the magnetization of the weak layer and the magnetization of the strong layer, thereby causing a variation in the magnetoresistive response. Under these conditions, it is possible to define two mutually orthogonal axes PE and PA which, in the absence of field, are parallel to the magnetization directions of the strong and weak layers respectively.

Figure 5:
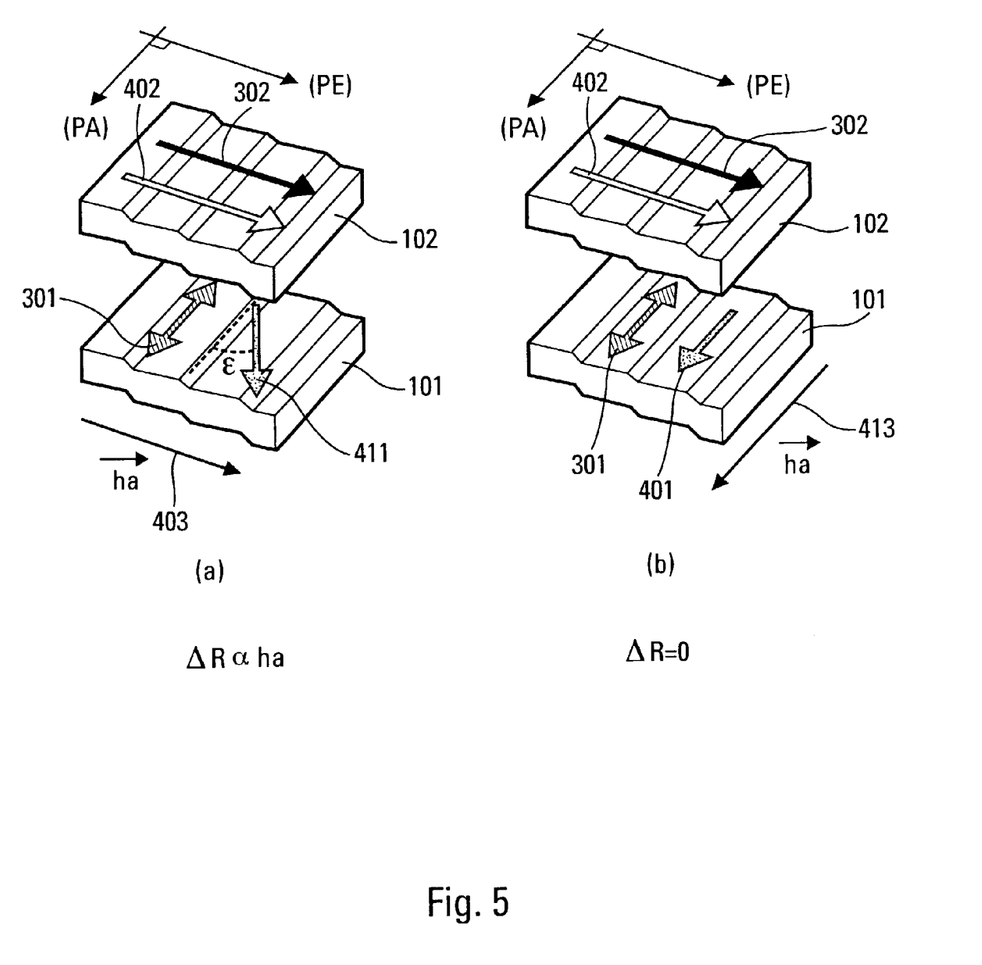
FIG. 5 is a perspective view showing the influence of a weak magnetic field depending on its orientation.

As shown in FIG. 5a, when the field ha is parallel to the axis PE, a large rotation of the magnetization 411 of the FM1 layer 101 is obtained.

Conversely, when the field ha is parallel to the direction PA, as in FIG. 5b, the influence of this field ha, 413, is approximately zero since the strong anisotropy field $H_k^2$ locks the magnetization of the FM2 layer 102.

Under these conditions, only the component of the field along PE will have the effect of varying the relative angle between the two magnetizations, and therefore the magnetoresistive signal. As a result, when the field ha, while remaining constant, changes orientation in the plane of the sensor, the corresponding variation in the magnetoresistive signal is represented by a cosine function. The variations in this signal are then a few percent of the total magnetoresistance.

On the other hand, when this field ha is strong, that is to say when it is between $H_k^1$ and $H_k^2$, this field is high enough to be able to saturate the FM1 layer 101 along its direction. When this strong field then rotates in the plane of the layers, the magnetization of FM1 describes the entire plane, whereas the magnetization of FM2 remains locked by the exchange anisotropy. Under these conditions, the antiparallel magnetic state between the two layers can be achieved and a maximum magnetoresistive response is then obtained.

However, the value of the applied field must not become greater than the value of the anisotropy field of FM2, that is to say ha must not be greater than $H_k^2$, because in this case the two magnetizations have a tendency to become aligned in a parallel fashion. This results in a reduction in the magnetoresistive signal and in an angular distortion of the response of the sensor.

As mentioned above, the sensitivity of such a sensor is limited in particular by the noise associated with thermal drift. To reduce this, it has been proposed, in the case of the GMR-type sensors, to use a structure in the form of a Wheatstone bridge, which makes it possible to subtract the DC component of the resistance without affecting the useful signal. Mention may more particularly be made of the work by J. K. Spong et al., published in IEEE Transactions on Magnetics, Vol. 32.2 (1996).

Figure 6:
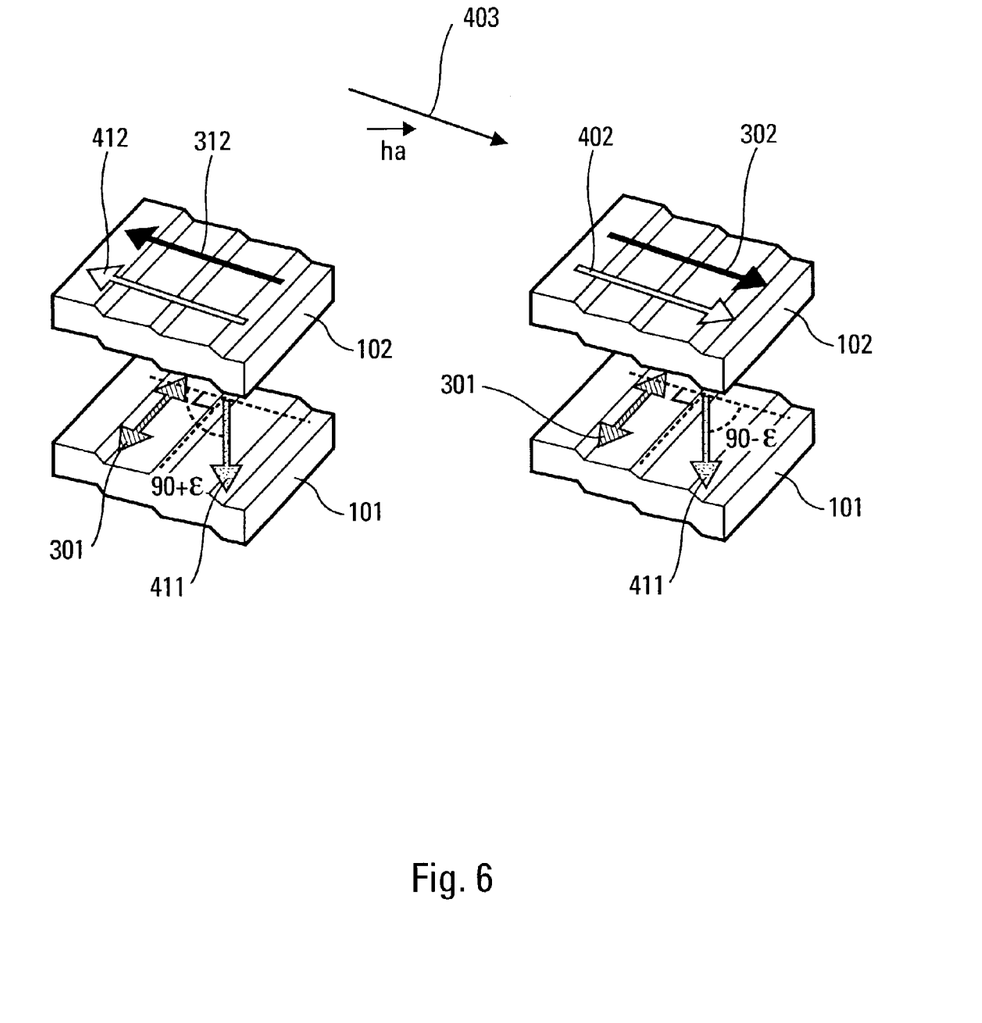
FIG. 6 is a perspective view of two sensors having opposed electrical responses.

To do this, the situation as in the case shown in FIG. 6 is set up, in which the signal ha to be measured, 403, is parallel to the magnetization direction of the FM2 layer 102. Since the direction of magnetization 301 of the weak layer 101 is perpendicular to the direction of magnetization 402, the system is in what is called a CAP geometry. Under these conditions, there are, as shown in this FIG. 6, two types of CAP configuration, denoted by CAP+ and CAP-, respectively.

In the CAP+ configuration, the field ha 403, arbitrarily considered positive in the configuration of the figure, results in an increase in the relative angle between the two magnetizations. This results in a variation in the magnetoresistive signal, which is itself arbitrarily considered to be positive.

In the CAP- configuration, the same positive field ha is in the opposite sense to the magnetization of the FM2 layer 102. This results in a decrease in the relative angle between the two magnetizations of the two layers and therefore a variation in the magnetoresistive signal, of opposite sign to that obtained with the CAP+ cell, which will be arbitrarily considered to be negative.

Figure 7:
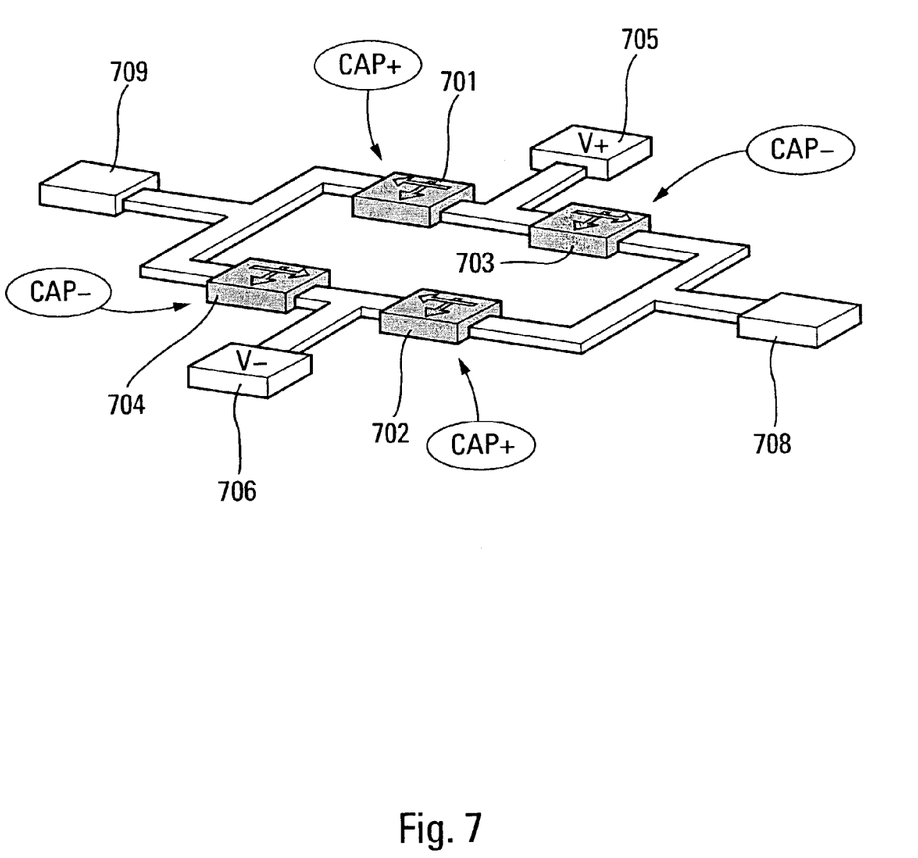
FIG. 7 is the arrangement of a device as a Wheatstone bridge using individual sensors of the type shown in FIG. 6.

This makes it possible, by combining two CAP+ cells 701 and 702 with two CAP- cells 703 and 704, to form a Wheatstone bridge in which these cells are arranged so that the magnetizations of the strong layers of two adjacent cells are antiparallel. This bridge is supplied from a voltage source via two terminals 708 and 709 located, respectively, between the cells 702 and 703 on the one hand, and 701 and 704 on the other. The out-of-balance voltage of the bridge is then available at two terminals 705 and 706 located, respectively, between the cells 701 and 703 on the one hand, and 702 and 704 on the other. The voltage difference between V+ and V- thus obtained is directly proportional to the difference in the signals delivered by the CAP+ and CAP- sensors and is therefore proportional to the useful signal.

To obtain correct measurements, above all with great accuracy and for fields of low values, it is not possible in practice to produce four separate measurement cells and then assemble them in order to obtain the bridge in FIG. 7. This is because the dispersion in fabrication on the one hand and the errors in aligning the planes of the four cells on the other, together with their separations, would not then allow satisfactory results to be obtained.

It is therefore necessary to produce a monolithic device comprising a single subject on which the four layers, defined in relation to FIG. 1, are deposited simultaneously. The whole assembly is then etched, chemically or by an ion beam, in order to isolate the four cells. In this way, very satisfactory homogeneity and geometrical arrangement are obtained.

The problem then consists in obtaining the suitable orientations of the magnetizations of the strong layers of these cells.

To do this, the invention proposes to apply a local field to each cell, the orientation of the field being the reverse of that applied to the adjacent cells during the cell polarization process, that is to say during the cooling that allows the magnetizations thus defined to be set in the strong layer.

Figure 8:
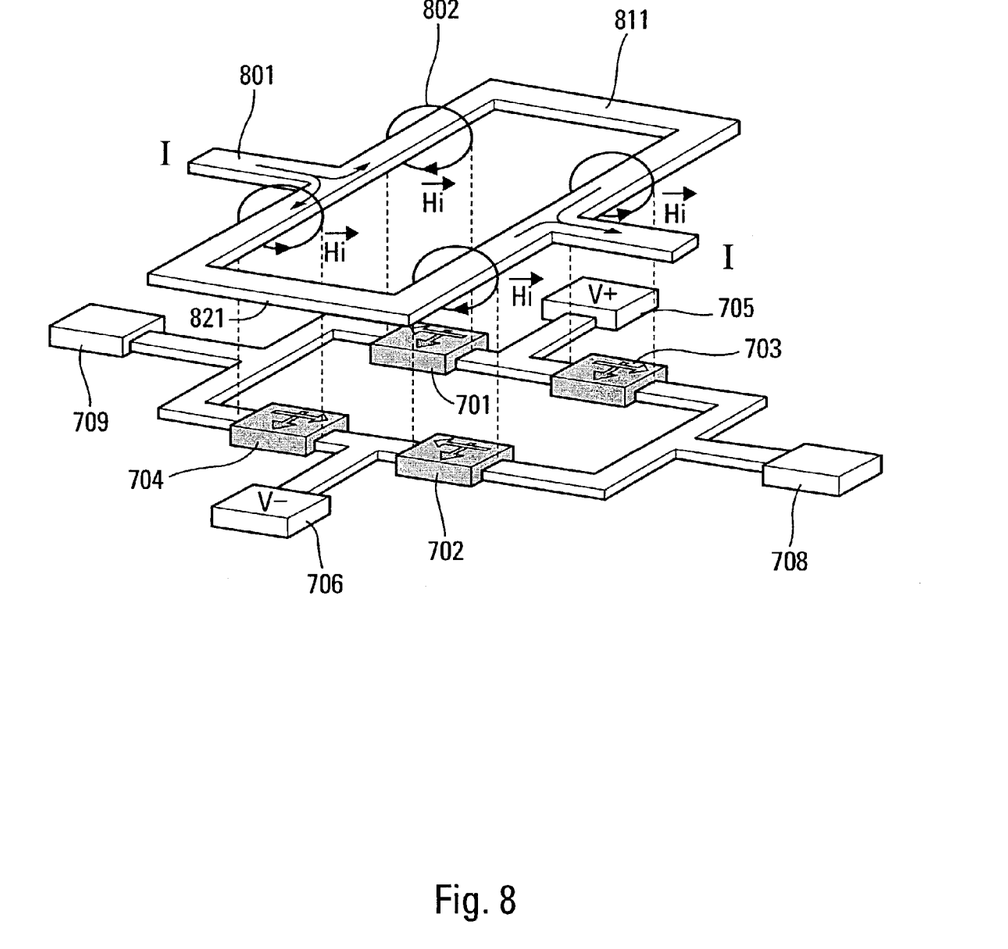
FIG. 8 is an arrangement explaining the way of polarizing the cells of the Wheatstone bridge in FIG. 7.

One of the means for obtaining these separate fields consists, as shown in FIG. 8, in using an isolated conducting line 801 which splits into two branches 811 and 821 passing over the top of the CAP cells 701 and 704 in such a way that the magnetic fields 802 induced by the four arms of these two branches 811 and 821 passing over the top of the CAP cells have the desired directions for polarizing these cells in the desired manner.

One method of doing this consists in producing these two branches 811 and 821 in the form of a square, allowing the arms to pass over the top of the cells in the correct direction. Since the local magnetic field needed to saturate the strong magnetizations of the cells is of the order of a few tens of oersteds, the current to be made to flow in the electrical circuit need not be high, which may be completely compatible with a microelectronics-type technology.

What is claimed is:

1. A magnetic field sensor utilizing magnetoresistance, comprising:
   a first ferromagnetic layer having a first magnitude of magnetization along a first direction of magnetization;
   a non-magnetic contacting substrate the first ferromagnetic layer and including a misoriented surface that induces the first direction of magnetization toward or along a preferential direction;
   a second ferromagnetic layer having a second magnitude of magnetization along a second direction of magnetization; and
   an insulating layer forming a tunnel junction between the first and second ferromagnetic layers,
   wherein the preferential direction and the second direction of magnetization are perpendicular to one another.

2. The sensor as claimed in claim 1, wherein the second direction of magnetization is induced by an antiferromagnetic layer superposed on the second ferromagnetic layer.

3. A process for manufacturing a sensor as claimed in claim 2, wherein the first ferromagnetic layer is deposited on a misoriented substrate to induce the first direction of magnetization by a shape energy.

4. The process as claimed in claim 3, wherein the second ferromagnetic layer is heated above a Néel temperature of the antiferromagnetic layer in contact with the second ferromagnetic layer, and
   the second ferromagnetic layer is cooled below the Néel temperature while applying a saturation magnetic field directed along the second direction of magnetization.

5. The sensor as claimed in claim 1, wherein the first magnitude of magnetization is less than the second magnitude of magnitization.

6. The sensor as claimed in claim 1, comprising two CAP+sensors and two CAP−sensors joined together to form a Wheatstone bridge in which each CAP+sensor is adjacent to a CAP−sensor.

7. A process for manufacturing a sensor as claimed in claim 6, wherein the first ferromagnetic layer is deposited on a misoriented substrate to induce the first direction of magnetization by a shape energy.

8. The process for manufacturing a sensor as claimed in claim 7, wherein the sensors are heated above a Néel temperature of the second ferromagnetic layer, and
   saturation magnetic fields are directed along the respective second directions of magnetization of the four sensors via an electrical circuit arranged above the sensors.

9. A process for manufacturing a sensor as claimed in claim 1, wherein the first ferromagnetic layer is deposited on a misoriented substrate to induce the first direction of magnetization by a shape energy.

10. The sensor as claimed in claim 1, wherein an angle formed between the first direction of magnetization and the preferential direction corresponds to a magnitude of an external magnetic field applied to the sensor.

11. The sensor as claimed in claim 10, wherein the angle between the first direction of magnetization and the preferential direction is a substantially linear function of the magnitude of the external magnetic field.

12. The sensor as claimed in claim 11, wherein the external magnetic field is applied perpendicular to the preferential direction.

* * * * *

UNITED STATES PATENT AND TRADEMARK OFFICE
CERTIFICATE OF CORRECTION

PATENT NO. : 7,094,480 B2  Page 1 of 1
APPLICATION NO. : 10/276693
DATED : August 22, 2006
INVENTOR(S) : Nguyen Van Dau et al.

It is certified that error appears in the above-identified patent and that said Letters Patent is hereby corrected as shown below:

On the title page, Item (30), the Foreign Application Priority Data Item (30) should read:

-- (30)  Foreign Application Priority Data

May 19, 2000  (FR) ...................................................00 06453 --

Signed and Sealed this

Twenty-third Day of January, 2007

JON W. DUDAS
*Director of the United States Patent and Trademark Office*